United States Patent
Panis

(10) Patent No.: US 7,349,818 B2
(45) Date of Patent: Mar. 25, 2008

(54) DETERMINING FREQUENCY COMPONENTS OF JITTER

(75) Inventor: Michael Panis, Somerville, MA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/272,027

(22) Filed: Nov. 10, 2005

(65) Prior Publication Data

US 2007/0118316 A1   May 24, 2007

(51) Int. Cl.
*G01R 29/26* (2006.01)
(52) U.S. Cl. ........................................ 702/69
(58) Field of Classification Search ................ 702/69
See application file for complete search history.

(56) References Cited

U.S. PATENT DOCUMENTS

| | | | |
|---|---|---|---|
| 4,660,197 | A | 4/1987 | Wrinn et al. |
| 5,604,751 | A | 2/1997 | Panis |
| 5,673,272 | A | 9/1997 | Proskauer et al. |
| 5,938,780 | A | 8/1999 | Panis |
| 6,609,077 | B1 | 8/2003 | Brown et al. |
| 6,819,192 | B2 | 11/2004 | Gauthier et al. |
| 2004/0260492 | A1 | 12/2004 | Halle et al. |
| 2005/0086016 | A1 | 4/2005 | Viss |
| 2005/0149801 | A1* | 7/2005 | Oshima ................. 714/731 |
| 2007/0118315 | A1* | 5/2007 | Panis et al. ............. 702/69 |
| 2007/0203659 | A1* | 8/2007 | Yamaguchi et al. ....... 702/69 |

FOREIGN PATENT DOCUMENTS

WO      0212909      2/2002

OTHER PUBLICATIONS

Hong et al., "An Efficient Random Jitter Measurement Techinique Using Fast Comparator Sampling", "23rd IEEE VLSI Test Symposium", pp. 123-130, Publisher: IEEE, Published in: Piscataway, NJ.
"Understanding and Characterizing Timing Jitter", "www.tektronix.com/jitter", 2003, pp. 1-24, Publisher: TEKTRONIX.

* cited by examiner

*Primary Examiner*—John Barlow
*Assistant Examiner*—Cindy D. Khuu
(74) *Attorney, Agent, or Firm*—Fogg & Powers LLC; Scott V. Lundberg

(57) ABSTRACT

A method of determining frequency components of jitter in a waveform is provided. The method includes conducting a plurality of locally-in-order strobings of the waveform. Changing the acquisition time associated with each locally-in-order strobing. Measuring jitter associated with each locally-in-order strobing and determining jitter as a function of frequency based on the measured jitter associated with each change of acquisition time.

10 Claims, 11 Drawing Sheets

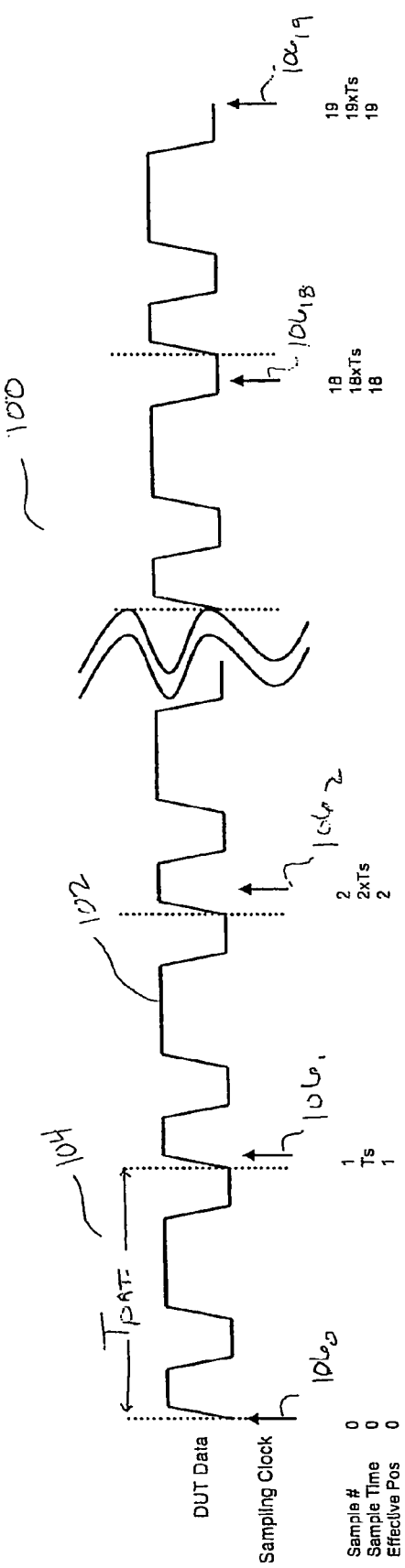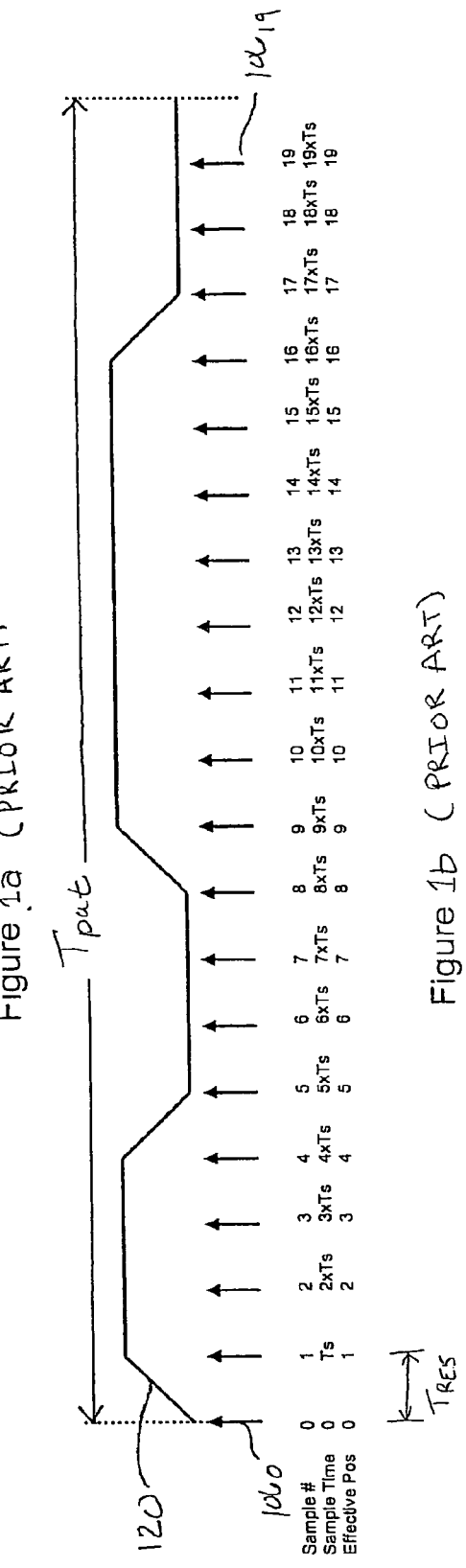
Figure 1a (PRIOR ART)
Figure 1b (PRIOR ART)

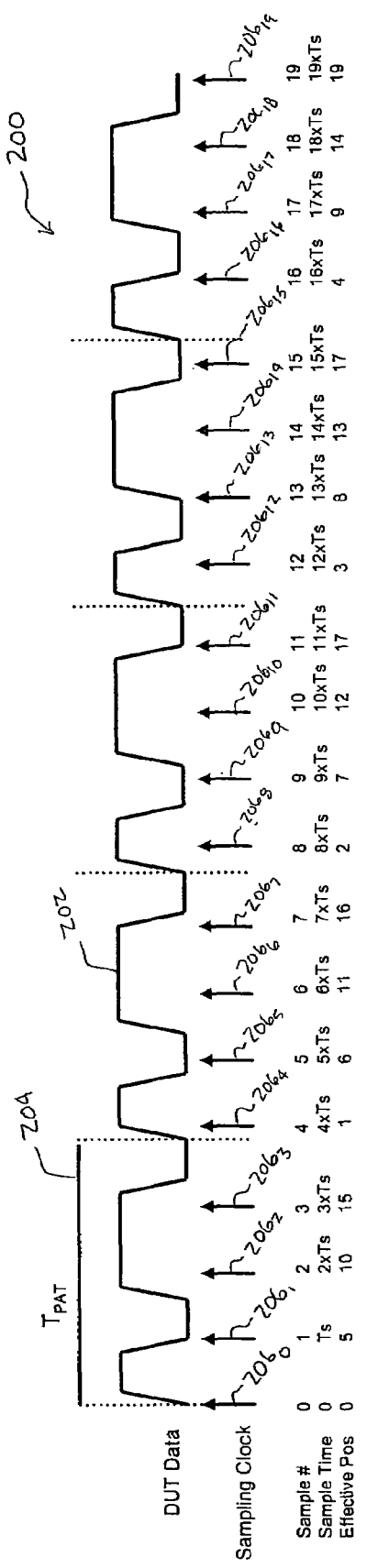
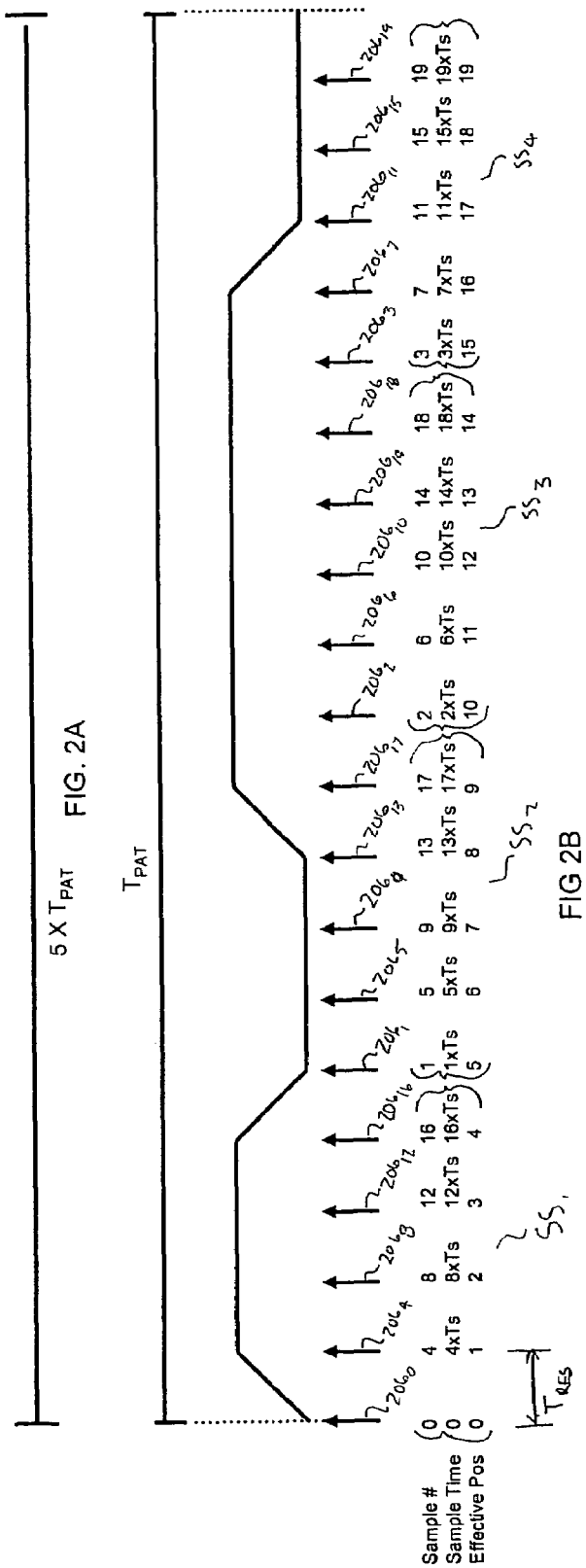
FIG. 2A
FIG 2B

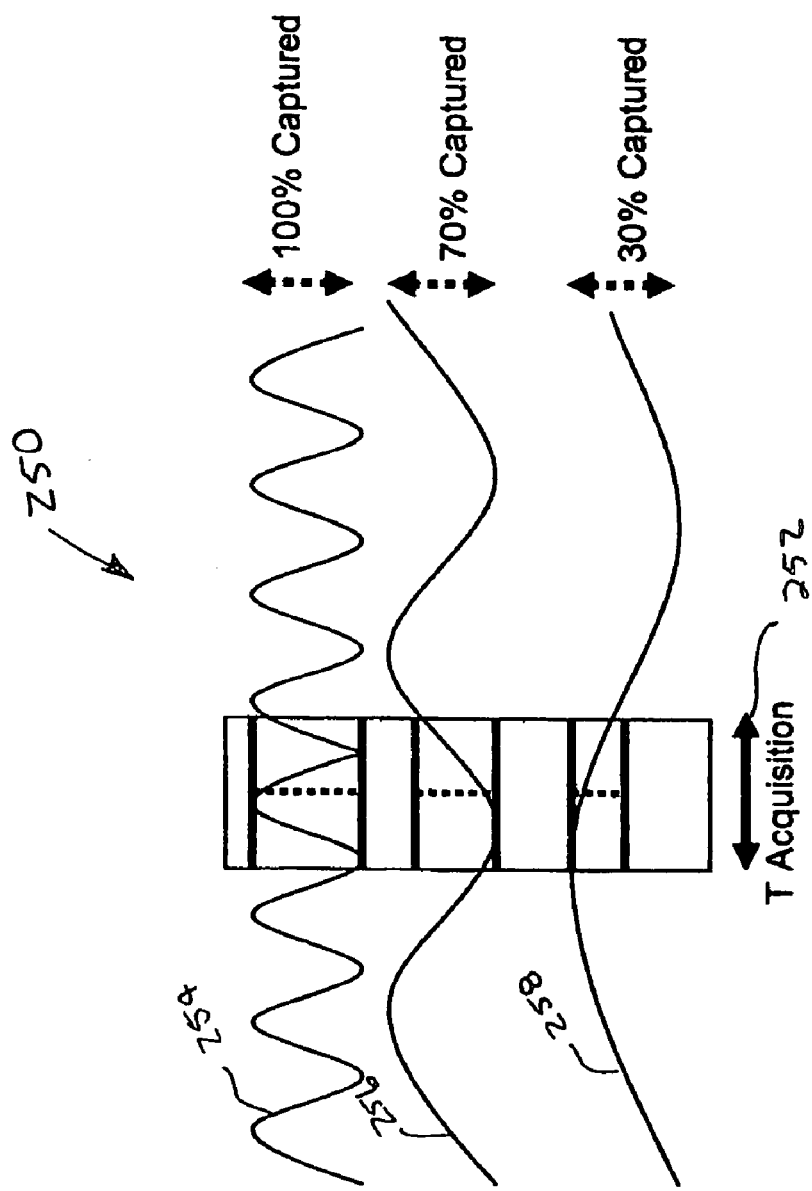

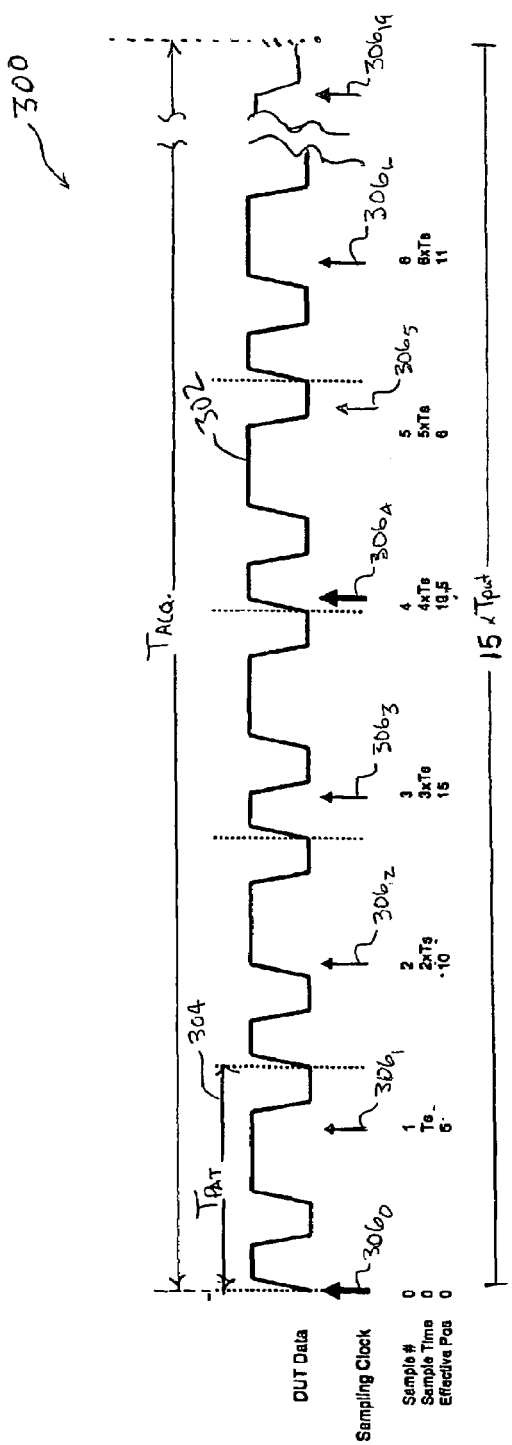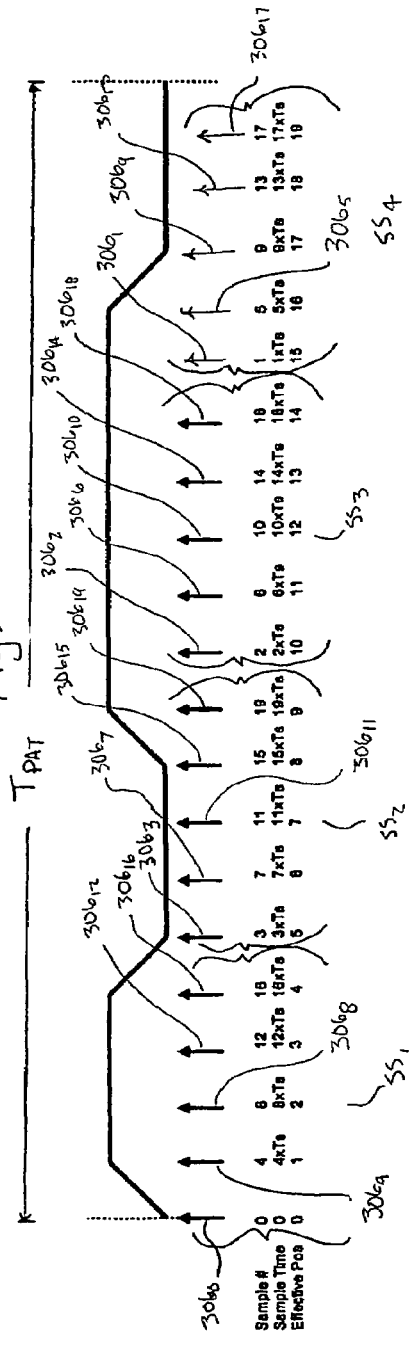
Fig. 3a
Fig. 3b

DETERMINING FREQUENCY COMPONENTS OF JITTER

CROSS REFERENCE TO RELATED CASE

This application is related to U.S. patent application Ser. 11/271,507, with a title "LOCALLY IN-ORDER STROBING" filed on even date herewith, which is incorporated herein by reference in its entirety.

TECHNICAL FIELD

The present invention relates generally to the measurement of jitter in a waveform and more particularly to measurement of frequency components of jitter.

BACKGROUND

Automatic test equipment is commonly used by electronics device manufacturers for detecting manufacturing defects. For example, automatic test equipment allows semiconductor device manufacturers to test, on a large volume basis, the functionality of each device sold in the marketplace. The tester drives signals to and detects signals from a device-under-test (DUT) and evaluates the detected results to expected values. Timing jitter degrades electrical systems and the push to higher data rates and lower logic swings has increased interest and necessity for the measurement and characterization of jitter.

Jitter is a key performance factor in high-speed data communications. Jitter is defined as the misalignment of the significant edges in a sequence of data bits from their ideal positions. Misalignments can result in data errors. Tracking these errors over an extended period of time determines system stability. Jitter can be due to deterministic and random phenomena. Determining the level of these jitter components guides design improvement.

Jitter measurement techniques typically have the ability to measure the timing of significant edges in a data stream. For example, oscilloscopes and digitizers have been used to measure the voltage of a signal at fixed time intervals and to analyze this data to determine edge times. Other examples are time interval analyzers and time stampers. These devices directly measure edge times or the time between a pair of edges. In yet another example, asynchronous strobing comparator techniques are used to measure whether a signal is above or below a threshold at fixed time intervals. Asynchronous strobing comparator techniques use stochastic mathematical techniques on the measurement data to determine characteristics of the edge times. Two general methods are used to establishing a fixed time interval with the asynchronous strobing (or sampling) techniques. The methods are "in-order" and "out-of-order" strobing. Shortcomings exist for both the in-order and out of order strobing techniques. For example, in-order strobing has low noise immunity and long acquisition times and out of order strobing is sensitive to frequency errors, requires a complex setup for measurement and provides limited ability to analyze the frequency characteristics of the signal.

Desired information with regard to frequency characteristics of a signal is the measurement of jitter as a function of frequency. Oscilloscopes, digitizers, time interval analyzers, and time stampers provide a method to measure jitter as a function of frequency, but they are relatively expensive. In-order sampling asynchronous strobing techniques can measure jitter as a function of frequency. However, the long acquisition times required of in-order sampling limits the frequencies it can measure to relatively low frequencies that are of no interest. Current out-of-order asynchronous sampling techniques do not provide a method to measure jitter as a function of frequency.

For the reasons stated above, and for other reasons stated below which will become apparent to those skilled in the art upon reading and understanding the present specification, there is a need in the art for an asynchronous sampling method of measuring the jitter found in a waveform as a function frequency that is effective at measuring desired frequencies and is relatively inexpensive.

SUMMARY

The above-mentioned problems as well as other problems are addressed by embodiments of the present invention and will be understood by reading and studying the following description.

In one embodiment, a method of determining frequency components of jitter in a waveform is provided. The method includes conducting a plurality of locally-in-order strobings of the waveform. Changing the acquisition time associated with each locally-in-order strobing. Measuring jitter associated with each locally-in-order strobing and determining jitter as a function of frequency based on the measured jitter associated with each change of acquisition time.

In another embodiment, a jitter frequency determining system is provided. The system includes a comparator, a clock source, a latching circuit, a memory device and a processor. The comparator is adapted to receive at least one output signal from a device under test and compare the output signal to an expected signal. The output signal has a repeating pattern. The clock source is adapted to produce a sampling clock based on user inputs, wherein the user inputs comprise a number of bits per one period of the repeating pattern, a length of a single bit period, a target effective sampling resolution and a number of times to sweep the repeating pattern. The clock source is further adapted to change the time between locally-in-order strobes to adjust the measurement bandwidth. The latching circuit is adapted to obtain samples of the output signal according to the sampling clock. The memory device is adapted to store the sampled data. The processor is adapted to analyze the stored data to determine jitter and to express jitter as a function of frequency.

In yet another embodiment, a machine readable medium having instructions stored thereon for processing jitter measurements is provided. The method includes expressing jitter magnitude as a function of acquisition time and expressing jitter as a function of frequency since the frequency of jitter is a function of the acquisition time.

In still another embodiment, a jitter measurement system is provided. The system includes a means to determine jitter measurements in a locally-in-order strobing scheme, a means for changing an acquisition time in the locally-in-order strobing scheme and a means for expressing jitter as a function of frequency.

In further still another embodiment, a method of determining frequency components of jitter in a waveform is provided. The method comprises strobing a waveform having a repetitive pattern. Forming a locally-in-order strobing scheme of a representative one of the repetitive pattern including subsets of locally-in-order strobes. Locating transition regions in the subsets of locally-in-order strobes. Determining random jitter associated for each transition region and determining jitter as a function of frequency.

BRIEF DESCRIPTION OF THE DRAWINGS

The present invention will be more easily understood and further advantages and uses thereof more readily apparent, when considered in view of the description of the preferred embodiments and the following figures in which:

FIG. 1a is a graphical illustration of one embodiment of signal strobe measurement using a walking strobe according to the teachings of the prior art.

FIG. 1b is a graphical illustration of an in-order strobing of the signal strobe measurement of FIG. 1(a) according to the teaching of the prior art.

FIG. 2a is a graphical illustration of one embodiment of signal strobe measurement using a walking strobe (locally-in-order strobing) according to the teachings of the present invention.

FIG. 2b is a graphical illustration of a locally-in-order strobing of the signal strobe measurement of FIG. 2a in one embodiment of the present invention.

FIG. 2c is an illustration of the frequency jitter magnitude in relation to the acquisition time of a set of strobes that comprise a subset, as shown in FIG. 2b.

FIG. 3a is a graphical illustration of another embodiment of signal strobe measurement (locally-in-order strobing) using a walking strobe of the present invention.

FIG. 3b is a graphical illustration of a locally-in-order strobing of the signal strobe measurement of FIG. 3a in one embodiment of the present invention.

Figure 2D:
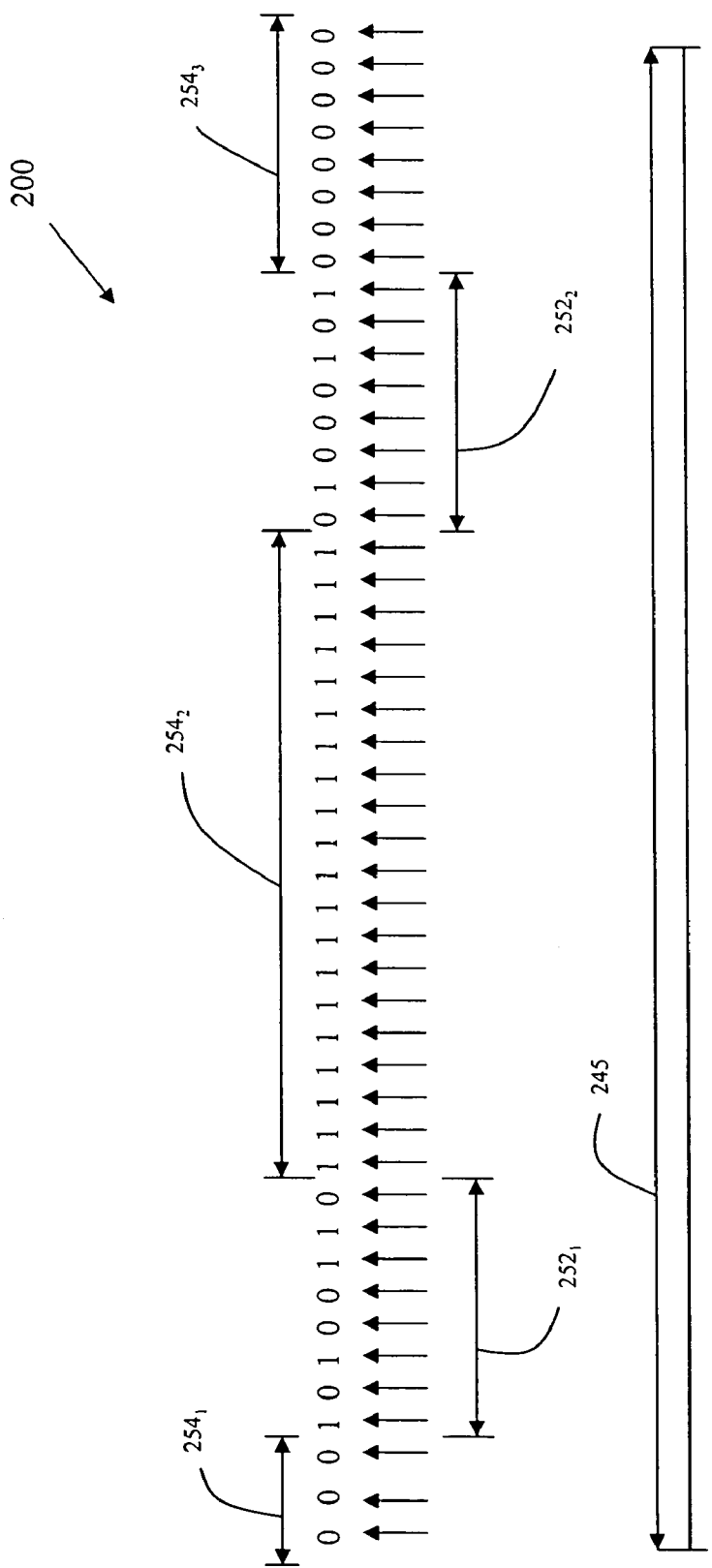
FIG. 2d is a representative illustration of digital results of the strobing of a locally-in-order waveform.

In accordance with common practice, the various described features are not drawn to scale but are drawn to emphasize specific features relevant to the present invention.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention provide methods and systems for improved signal strobing techniques. The present application is related to application number 117.005US01 filed herewith. The present application herein incorporates the 117.005US01 application in its entirety by reference. In embodiments of the present invention methods of determining frequency components of measured jitter are provided. In particular, in one embodiment, acquisition time and strobe spacing are adjusted to reveal different frequency components of measured jitter. As a result, jitter frequencies within a particular range can be differentiated.

Embodiments of the present invention are based on undersampling strobing techniques. In one embodiment, an undersampling strobing method uses a strobe that appears to walk across an output signal of a device under test (DUT). The DUT signal waveform has a repeating pattern and a sample is taken every time Ts over a repeating pattern of the signal waveform. Ts=(Tpat+Tres)/N. Wherein N is the number of strobes which is an integer greater than 1. Tpat is the period of time for a single pattern of the DUT waveform to occur. Tres is the effective sampling resolution.

The methods of undersampling are described as "Walking Strobe" because an asynchronous clock is used to describe a signal under test. The signal under test must be a repetitive pattern. The asynchronous nature of the strobe causes it to appear to walk across the test signal. As a result, even though the actual samples (or strobes) will be taken over a time period many times larger than that of the test pattern (T pat), they can be mapped to "effective times" all within Tpat. The samples are analyzed in M sub-sequences called "Strobe Subsets." Once remapped onto a single period Tpat of the DUT waveform, the strobes for a given strobe subset are effectively spaced by Tres and are in-order.

To provide further background, FIG. 1a is a graphical representation of an in-order undersampled DUT signal, shown generally at 100. Graph 100 includes a representation of DUT signal 102 being sampled at time intervals Ts by strobes $106_0$ through $106_{19}$ over twenty periods of Tpat 104. It will be understood that not all strobes have been shown in FIG. 1a. In this embodiment, it takes 20×Ts to acquire the data and Ts=(Tpat+Tres). FIG. 1b is a graphical representation of each of the 20 periods of DUT signal 102 from FIG. 1a overlaid on top of one another, respectively. A single period Tpat of DUT signal 120 is shown expanded with each strobe $106_0$ through $106_{19}$ spaced at Tres.

FIG. 2a is a graphical representation of an undersampled DUT signal, shown generally at 200, according to one embodiment of the present invention. In this embodiment, the acquisition of data is four times as fast as the acquisition of data for the DUT shown in FIGS. 1a and 1b. Graph 200 includes a representation of a DUT signal 202 being sampled at time intervals Ts by strobes $206_0$ through $206_{19}$ over five periods of Tpat 204. In this embodiment, it also takes 20×Ts to acquire the data but Ts is now 4 times shorter where Ts=(Tpat+Tres)/4. As a result, it only requires 5×(Tpat+Tres) to acquire the data versus 20×(Tpat+Tres) for the acquisition with respect to FIG. 1a.

FIG. 2b is a graphical representation of the five periods of DUT signal 202 from FIG. 2a overlaid on top of one another, respectively. A single period Tpat of DUT signal 202 is shown with each strobe $206_0$ through $219_{19}$ spaced at approximately Tres. In this embodiment, subsets of strobes are grouped for further analysis. In this example, four subsets of 5 strobes are defined. Subset 1 ($SS_1$) includes samples $206_0$, $206_4$, $206_8$, $206_{12}$ and $206_{16}$, from sample numbers 0, 4, 8, 12 and 16, subset 2 ($SS_2$) includes samples $206_0$, $206_5$, $206_9$, $206_{13}$ and $206_{17}$ from sample numbers 1, 5, 9, 13 and 17, subset 3 ($SS_3$) includes samples $206_2$, $206_6$, $206_{10}$, $206_{14}$ and $206_{18}$ from sample numbers 2, 6, 10, 14 and 18 and subset 4 ($SS_4$) includes samples $206_3$, $206_7$, $206_{11}$, $206_{15}$ and $206_{19}$ from sample numbers 3, 7, 11, 15 and 19. Each subset $SS_1$-$SS_4$ contains samples that are effectively, locally in-order and are each separated by Tres. Moreover, the total acquisition time of the locally-in-order strobing (i.e. the time it took to acquire all the data gathered for the locally-in-order strobing) is close to the total acquisition time to strobe the five periods of the DUT signal since the strobes in the subsets SS1, SS2, SS3 and SS4 interleave each other throughout the five periods required to sample the DUT signal.

A method of sampling is provided where locally-in-order strobes are taken for each repetition of test pattern Tpat. Each strobe subset $SS_1$-$SS_4$ appears to walk across a portion of the pattern. In one embodiment, locally-in-order strobing of FIGS. 2a and 2b is applicable to jitter measurement and provides advantages over current methods of strobing for jitter measurement. For example the locally-in-order strobing method as described above reduces the time to acquire strobing samples. Moreover, the amount of low frequency noise detected by a measurement increases as the time to perform that measurement increases. Since locally-in-order sampling generally takes less time than in-order sampling, it is less susceptible to low frequency noise. This is further described in the following paragraphs.

Since the strobes for a given strobe subset are locally-in-order, they are not subject to many of the problems associated with out-of-order sampling. The acquisition takes the reduced time of out-of-order sampling as more than one strobe is taken for each repetition of the test pattern. Each strobe subset is analyzed in-order and the results are combined to provide results for the entire pattern. Using the locally-in-order sampling method achieves the benefits of in-order and out-of-order strobing techniques without the problems of either technique.

As a result, the individual subsets described with respect to FIG. 2b are utilized in performing frequency analysis of the waveform over time. FIGS. 2a and 2b are meant for illustration and it is understood that any number of strobes may be utilized. After all analyses are complete, jitter magnitude can be expressed as a function of acquisition time. An example of the frequency jitter magnitude in relation to the embodiment of FIG. 2a is illustrated in FIG. 2c. In particular, FIG. 2c illustrates how the magnitude of different frequency jitter is captured during the acquisition period associated with FIG. 2b. As illustrated in FIG. 2c, the total magnitude of high frequency jitter 254 is captured within this acquisition time (T acquisition). However, the magnitude of mid frequency jitter 256 is only 70% captured and the magnitude of low frequency jitter is only 30% captured within this acquisition time.

In some embodiments of the present invention, the acquisition time is either increased or decreased depending on the level of information needed for jitter analysis. Since, information required to calculate jitter is determined as we walk across an effective edge, not across the effective width of a strobe region, only the transition acquisition time or period needs to be considered. For example, referring to FIG. 2d a representation of the digital results of a strobing of a locally-in-order waveform is provided. In this example, periods of stable data signals $254_1$, $254_2$ and $254_3$ and transition periods $252_1$ and $252_2$ make up the total acquisition time, generally designated as 245, of the locally-in-order strobing in FIG. 2d. Accordingly, since we are only interested in the transition periods $252_1$ and $252_2$ only those transition periods need to be analyzed to determine jitter. The acquisition period (or time) for the transition regions of the locally-in-order strobing can be expressed as Ts×N× Tjitter/Tres. From this transition acquisition time equation frequency sensitivity of the measurement can be determined since the frequency sensitivity of the measurement is a function of acquisition time.

Referring to FIG. 3a another example of a graphical representation of an undersampled DUT signal, shown generally at 300 with an increased acquisition time of the present invention is provided. In this embodiment, time between consecutive strobes is increased by a factor of 3. The total acquisition time for this embodiment is then 15 $T_{PAT}$. FIG. 3b illustrates a graphical representation of a locally-in-order strobing over the fifteen periods ($T_{PAT}$ 306) of DUT signal 302 from FIG. 3a overlaid on top of one another, respectively. FIG. 3b illustrates subset one $SS_1$ including strobes $306_0$, $306_4$, $306_8$, $306_{12}$ and $306_{16}$, subset two $SS_2$ including strobes $306_3$, $306_7$, $306_{11}$, $306_{15}$ and $306_{19}$, subset three $SS_3$ including strobes $306_2$, $306_6$, $306_{10}$, $306_{14}$ and $306_{18}$ and subset four $SS_4$ including strobes $306_1$, $306_5$, $306_9$, $306_{13}$ and $306_{17}$. In this embodiment, the effective resolution of $T_{RES}$ is the same as the previous embodiment; only the time $T_s$ between strobes has been extended and the total $T_{ACQ}$ time is increased accordingly.

Figure 3C:
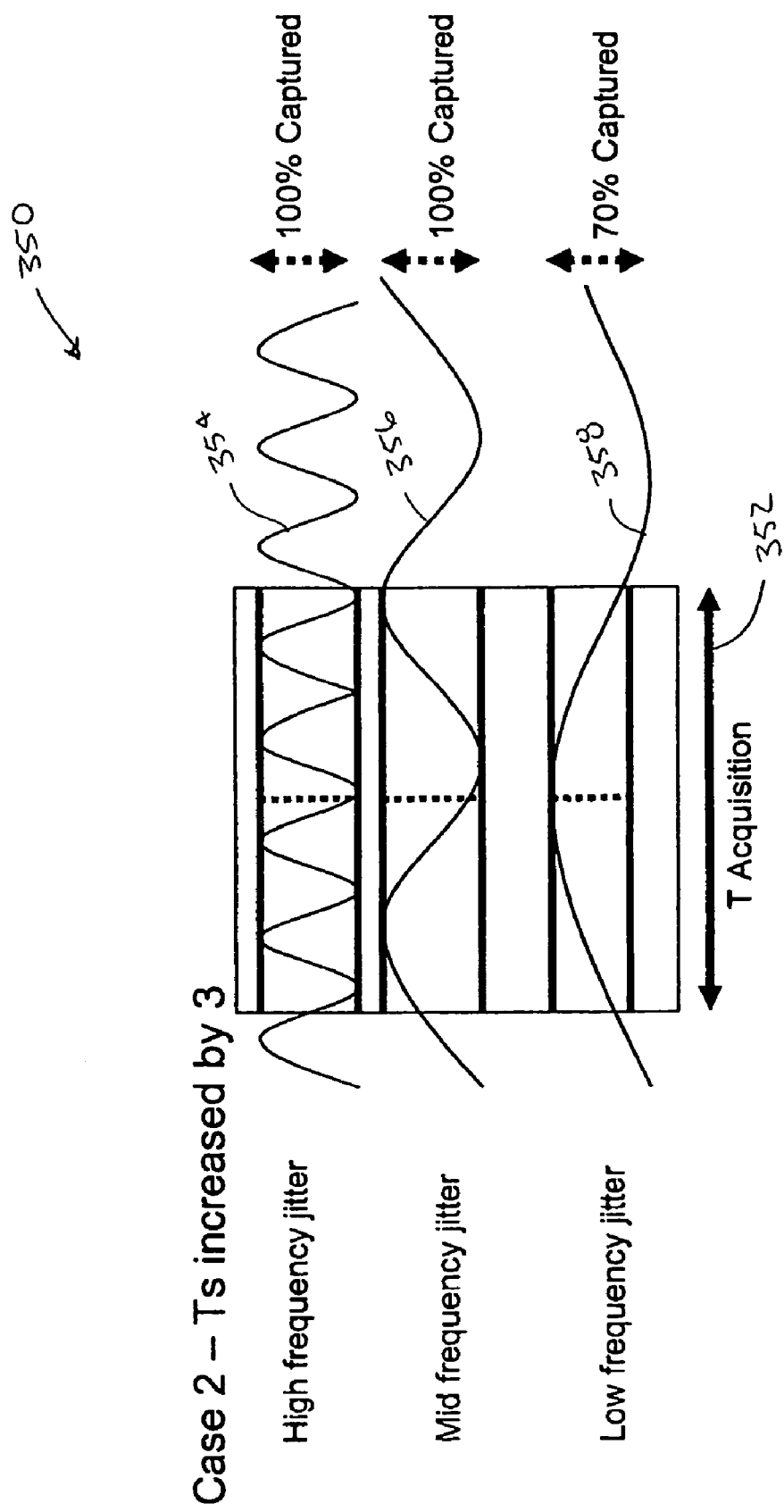
FIG. 3c is an illustration of the frequency jitter magnitude in relation to the acquisition time of a set of strobes that comprise a subset, as shown in FIG. 3b.

Referring to FIG. 3c an example of the frequency jitter magnitude in relation to the embodiment of FIG. 3b is illustrated. In this embodiment with the increased acquisition time 352, all of the high frequency 354 and mid frequency jitter 356 is captured. Moreover, 70% of the low frequency jitter 358 is captured. Accordingly, the increase in acquisition time has an impact on the frequency components and consequently the amount of jitter that is detected by the measurement. As illustrated, a jitter measurement of a given acquisition period will detect less low frequency jitter than high frequency jitter. However, an increase in acquisition time allows more of the lower frequency jitter to enter into the measurement. In embodiments of the present invention, sampling and analysis is repeated several times. Each time the signal is sampled, the acquisition time is changed by increasing the time between locally-in-order strobes. After all the analysis has been completed jitter magnitude as a function of acquisition time can be expressed. Moreover, since the frequency of jitter that gets measured is a function of the acquisition time, we can also express jitter as a function of frequency. Since each result will contain the jitter frequencies also contained in measurements with shorter acquisition times, we can differentiate the results to determine the jitter frequencies within a particular range.

Figure 4A:
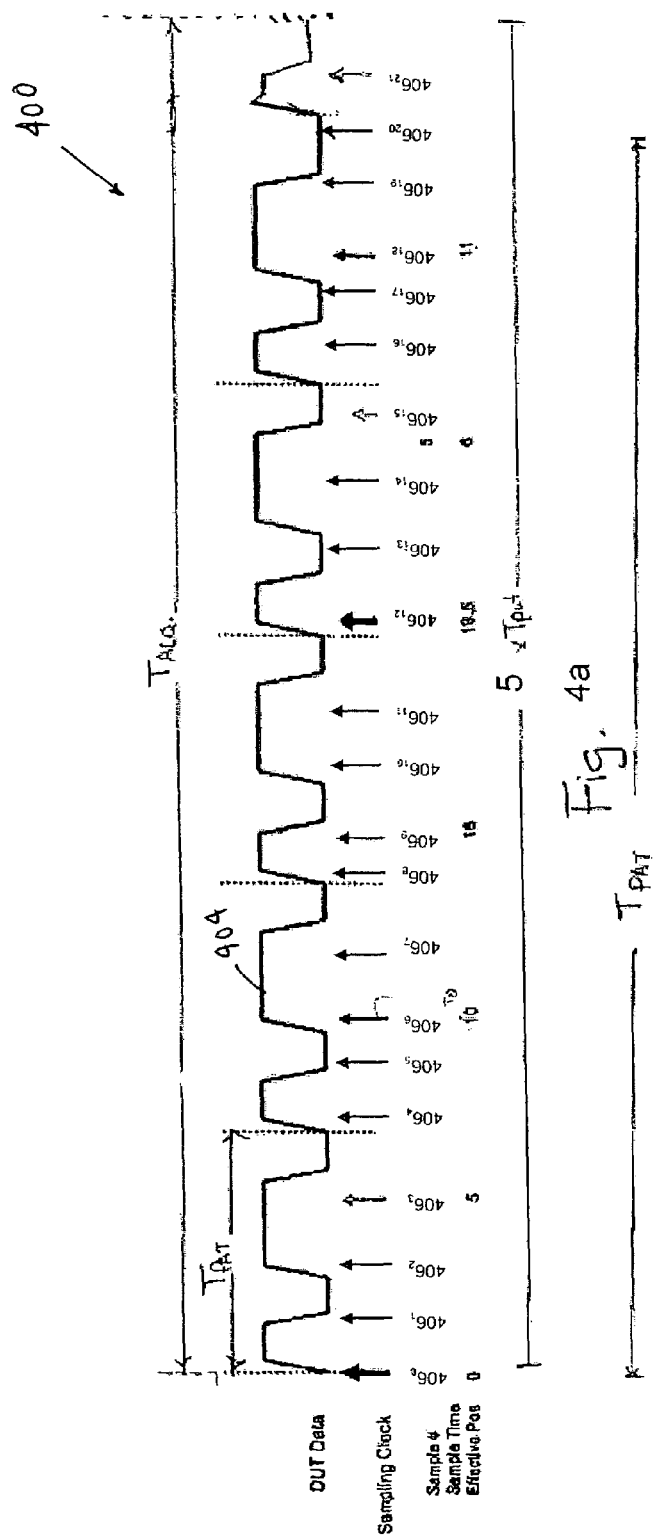
FIG. 4a is a graphical representation of an undersampled DUT signal according to one embodiment of the present invention.
Figure 4B:
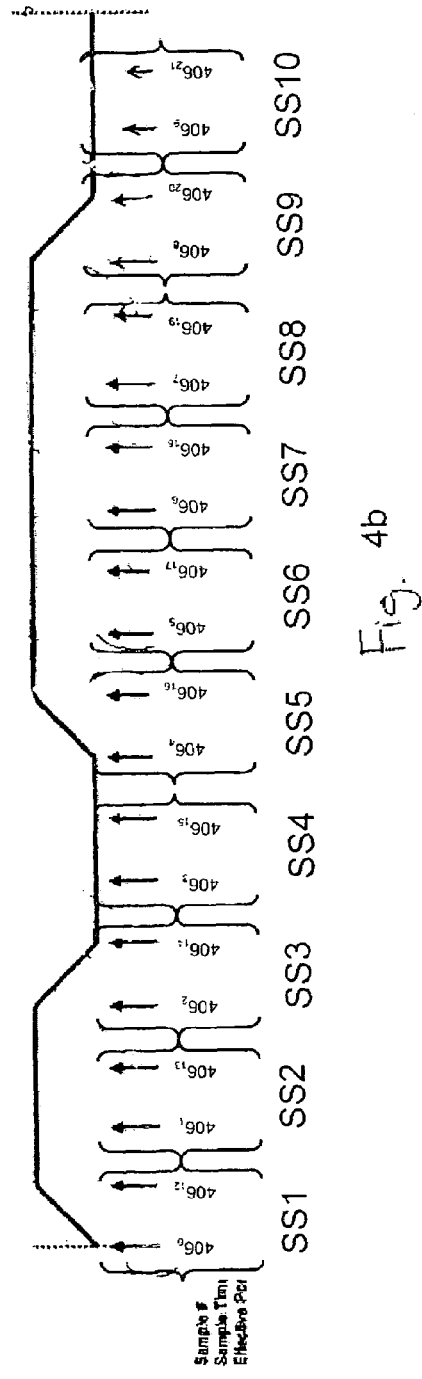
FIG. 4b is a graphical representation of the periods of a DUT signal from FIG. 4a overlaid on top of one another, respectively.

In another embodiment, the acquisition time between locally-in-order strobes, and consequently, the bandwidth of the jitter measurement, can be adjusted by increasing the time between locally-in-order strobes without substantially changing the time between strobes, Ts. For example, please refer to the embodiment illustrated in FIGS. 4a and 4b. FIG. 4a is a graphical representation of an undersampled DUT signal, shown generally at 400, according to one embodiment of the present invention and FIG. 4b is a graphical representation of the periods of DUT signal 404 from FIG. 4a overlaid on top of one another, respectively. As illustrated in FIG. 4a, waveform 404 is strobed or sampled by strobes $406_0$ through $406_{21}$. These strobes, strobes $406_0$ through $406_{21}$, are selectively positioned in subsets SS1 through SS10 as illustrated in FIG. 4b. In FIG. 4a, strobes in the same subset, such as strobes $406_0$ and $406_{12}$ of subset SS1, are spaced by $3 \times T_{PAT} + T_{RES}$ similar to the strobes in the embodiment illustrated in FIG. 3a. However, in this case the strobes are spaced by $3\times T_{PAT}+T_{RES}/12$ instead of $3\times T_{PAT}+T_{RES}/4$ in the subsets as is illustrated in FIG. 3b. Moreover, since $3\times T_{PAT}+T_{RES}/12$ is approximate to $T_{PAT}+T_{RES}/4$ (which is the spacing in the subsets of FIG. 2b), the strobes in the subsets of this embodiment will have about the same spacing as the strobes in the subsets of the embodiment illustrated in FIG. 2b. Moreover, the total acquisition time in this embodiment will be very close to the total acquisition time ($5T_{PATS}$) of the embodiment illustrated in FIG. 2a. Accordingly, in this embodiment, the acquisition time between locally-in-order strobes, and consequently, the bandwidth of the jitter measurement, can be adjusted by increasing the time between locally-in-order strobes without substantially changing the time between strobes, Ts.

As discussed above, the number of samples or strobes per total acquisition period can vary and this invention is not limited to a select amount. Moreover, in one embodiment of the present invention the bandwidth of the jitter measurement is adjusted by increasing the number of strobes and the number of sample subsets per acquisition period. This technique further allows the bandwidth of the measurement to be increased without increasing the overall acquisition time. Maintaining short overall acquisition times is important for keeping the time required to test a DUT short.

Figure 5:
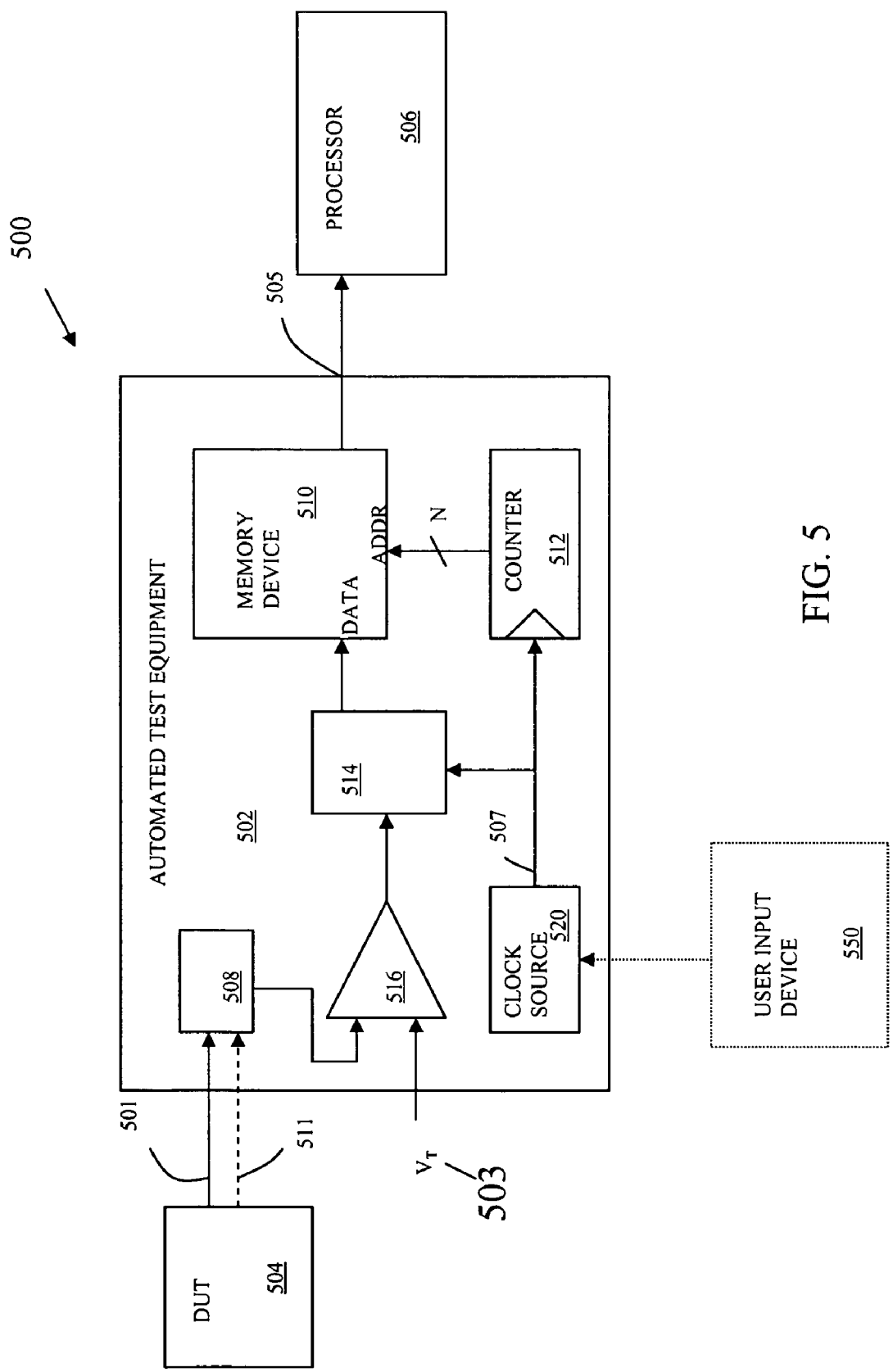
FIG. 5 is a block diagram of one embodiment of a system for strobing signals according to the teachings of the present invention.

FIG. 5 is a block diagram of a locally-in-order strobing system, shown generally at 500, according to one embodiment of the present invention. System 500 includes automated test equipment (ATE) 502 that receives one or more output signals 501, 511 from a device under test 504 and provides an output 505 to a processor 506 for analysis. In one embodiment, ATE 502 includes buffer 508 that feeds a buffered DUT output signal 501 to comparator 516. In one embodiment, buffer 508 is a differential buffer and receives differential data from DUT 504 via output signals 501 and 511. The one or more output signals are buffered and the buffered signal is compared to a reference signal $V_T$ 503 (an expected signal) to determine if the DUT performed as expected. In one embodiment, $V_T$ is a threshold representing the edge transition voltage. An output of comparator 516 is representative of the logical state of the DUT's output waveform. The output of the comparator 516 is fed into latch circuit 514 for sampling of the waveform based on sampling clock 507 produced by source clock 520. Sampling clock 507 is fed to counter 512 and latch 514 and samples of the DUT waveform are obtained. The samples are stored in memory device 510 for transmission to processor 506 for further analysis.

In one embodiment, clock source 520 is programmed to strobe the DUT waveform based on device specification and user inputs. User inputs are specific to the DUT and the desired signal information required. In one embodiment, ATE 502 further includes a user input device 550 that is either integral or remotely coupled to ATE 502. In one embodiment, software to perform logically in-order strobing resides within system 500 and utilizes user inputs received from user input device 550 to calculate and setup system 500 for jitter capture. In one embodiment, user inputs include one or more of the bit period or unit interval of the jitter measure pins, jitter measure pins, the number of bits per pattern, the target effective sampling resolution and the number of pattern repetitions. The jitter measure pins indicate which DUT transmit pins will be measured. The bits per pattern are the number of bits of the repeating pattern Tpat. The target effective sampling resolution (Tres) determines the effective sampling frequency. The number of pattern repetitions indicates how many times to effectively walk across the repeating DUT waveform pattern.

In one embodiment, processor 506 uses the captured data, the user inputs and device data to calculate random jitter Rj of the DUT waveform. Further in one embodiment, user inputs received from user input device 550 further include parameters which indicate measurement bandwidths. Further still in one embodiment, software to perform logically in-order strobing resides within system 500 and utilizes user inputs received from user input device 550 to calculate and setup system 500 for multiple jitter captures, each with a different bandwidth. In one embodiment, processor 506 uses the results from multiple measurements to express jitter magnitude as a function of acquisition time and jitter as a function of frequency.

Figure 6:
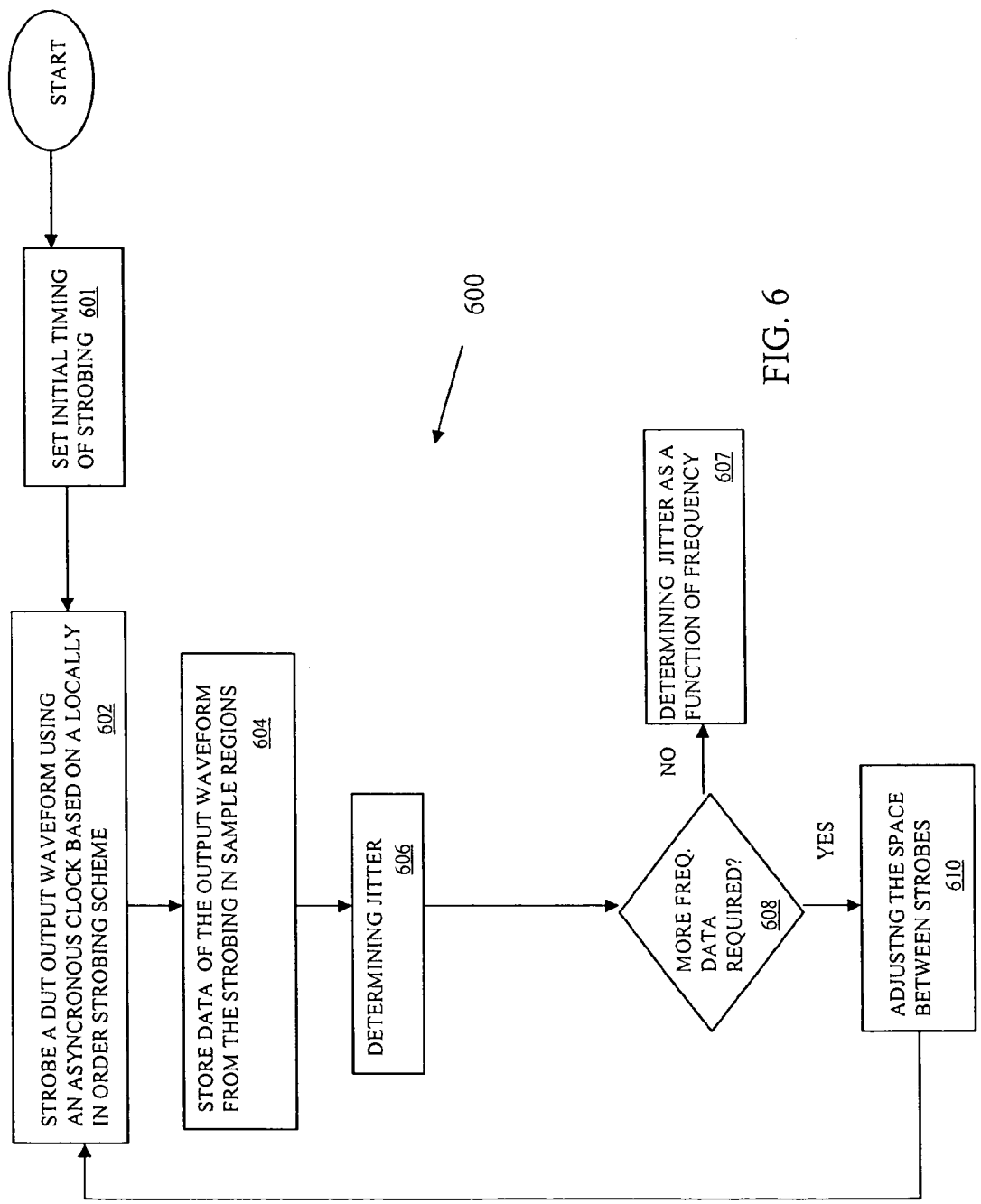
FIG. 6 is a flow chart for one embodiment of a method of determining frequency components of jitter in the present invention.

FIG. 6 is a flow chart for a logically in-order strobing technique, shown generally at 600, according to one embodiment of the present invention. The method comprises asynchronously digitally undersampling a device under test (DUT) output waveform. The method begins at 601 where an initial timing between strobes is set to achieve a bandwidth/frequency for an initial measurement. At 602 the strobing of a DUT output waveform using an asynchronous clock based on a locally-in-order strobing scheme is performed. Data obtained from the strobing is stored at 604. The stored data is then analyzed to determine jitter for the initial bandwidth/frequency at 606. It is then determined if more jitter frequency data is required at 608. If further data is required at 608, the spacing between locally-in-order strobes is adjusted at 610. The process then continues at 602 until no more jitter frequency data is required at 608. If no further data is required at 608, jitter as a function of frequency is determined at 607 from the multiple results, each of which pertains to a different measurement frequency. The process then ends. In one embodiment, jitter as a function of frequency is determined at 607 based on the fact that jitter magnitude can be expressed as a function of acquisition time and since the frequency of jitter is a function of acquisition time, jitter as a function of frequency can be determined. The equation for acquisition time used, is the transition acquisition time equation Tacq_trans=Ts× N×Tjitter/Tres where N is defined earlier and Tjitter is the peak to peak jitter of the DUT output waveform.

Figure 7:
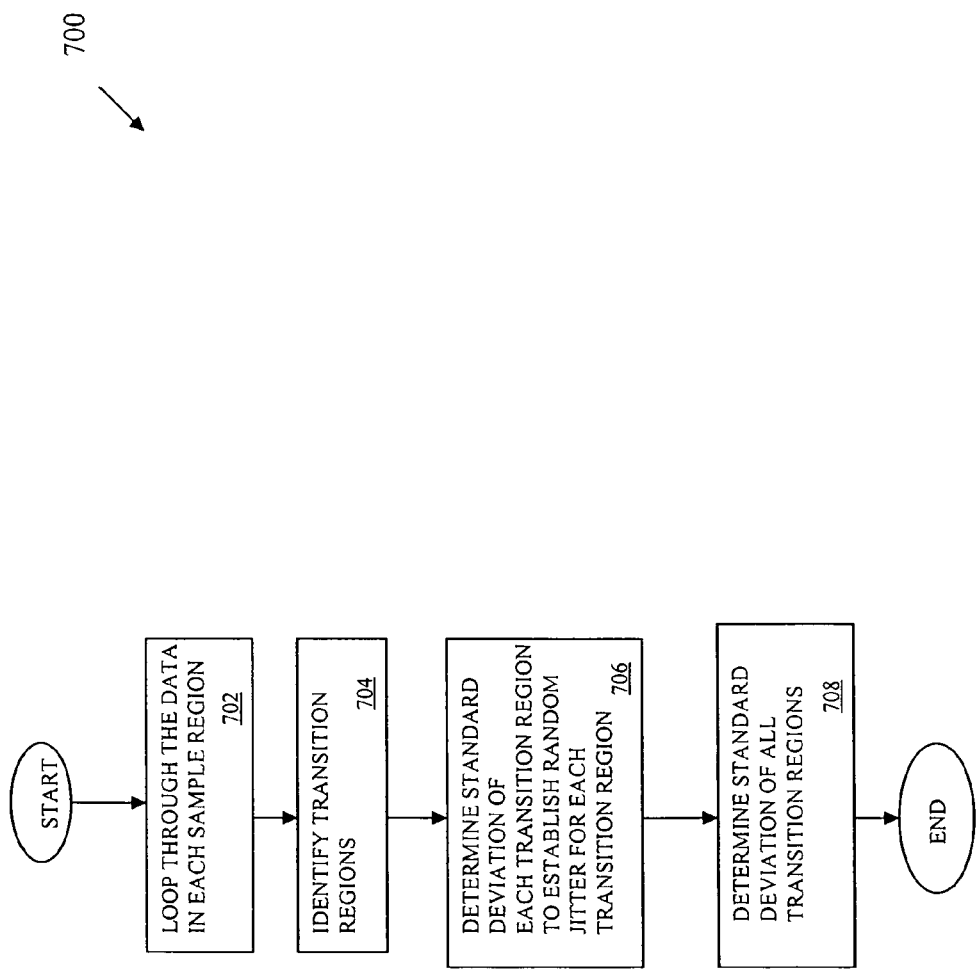
FIG. 7 is a flow diagram illustrating the determination of jitter in one embodiment of the present invention.

Referring to FIG. 7 a flow chart for determining jitter in a waveform, shown generally at 700, according to one embodiment of the present invention is provided. First at 702 the data within a sample region is looped through one sample at a time, starting at the first bit sampled and ending at the last bit sampled. Most of the data will consist of logically Lows or Highs surrounded by data of the same state. At 704, the transition regions are identified. The transition regions are identified as a set of data containing a mixture of zeros and ones like the example in FIG. 2d. Generally, a rule is needed to define what separates one transition region from another. For example, if the data in a waveform contains the equivalent of unit interval (UI)/4 of steady state, any different data will be considered the start of a new transition region. Moreover, a general rule is also needed to ignore data that may indicate a transition region at the beginning or the end of a sample region.

Since each transition region indicates an apparent edge, at 706 calculations are performed to determine the standard deviation of each transition edge. At 708, the standard deviation of all transition regions is determined. In one embodiment this is done by taking the average or root sum square average of the standard deviation of all the transition regions. For practical purposes, the standard deviation is the random jitter although it may contain negligible amounts of period jitter and the like. It is the random jitter (from the standard deviation) that is used in embodiments of the present invention to express jitter as a function of frequency.

Figure 8:
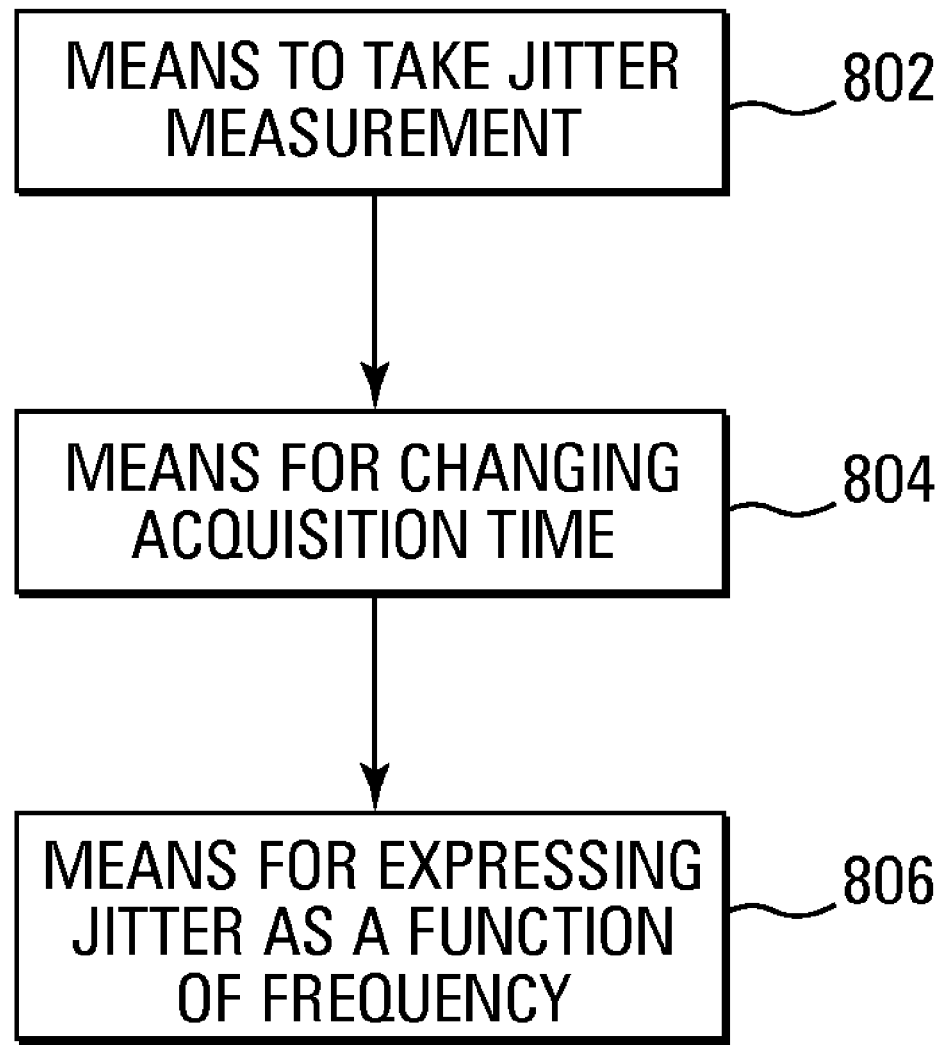
FIG. 8 is a block diagram illustrating the means functions of one embodiment of the present invention.

Referring to FIG. 8 a means block diagram is provided that illustrates the means functions of a test system, such as test system 502 of FIG. 5. As illustrated, the means block diagram includes a means to taking a jitter measurement (802). A means for changing the acquisition time (804) and a means for expressing jitter as a function of frequency (806).

As stated above, the methods and techniques described here are implemented by a locally-in-order strobing system. Embodiments of devices that make up the locally-in-order strobing system may be implemented in digital electronic circuitry, or with a programmable processor (for example, a special-purpose processor or a general-purpose process or such as a computer firmware, software, or in combinations of them). Apparatus embodying these techniques may include appropriate input and output devices, a programmable processor, and a storage medium tangibly embodying program instructions for execution by the programmable processor. A process embodying these techniques may be performed by a programmable processor executing a program of instructions to perform desired functions by operating on input data and generating appropriate output. The techniques may be implemented in one or more programs that are executable on a programmable system including at least one programmable processor coupled to receive data and instructions from, and to transmit data and instructions to, a data storage system, at least one input device, and at least one output device. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, specially-designed application-specific integrated circuits (ASICs).

Although specific embodiments have been illustrated and described herein, it will be appreciated by those of ordinary skill in the art that any arrangement, which is calculated to achieve the same purpose, may be substituted for the specific embodiments shown. This application is intended to cover any adaptations or variations of the present invention. Therefore, it is intended that this invention be limited only by the claims and the equivalents thereof.

What is claimed is:

1. A method of determining frequency components of jitter in a waveform, the method comprising:
    conducting a plurality of locally-in-order strobings of the waveform, wherein the locally-in-order strobings are based on undersampling strobing techniques that map strobes over a relatively large period of time to effective times within a test pattern;
    changing an acquisition time associated with each locally-in-order strobing;
    measuring jitter associated with each locally-in-order strobing; and
    determining jitter as a function of frequency based on the measured jitter associated with each change of acquisition time.

2. The method of claim 1, wherein changing the acquisition time of each locally-in-order strobing further comprises one of increasing a spacing between locally-in-order strobes and decreasing the spacing between locally-in-order strobes.

3. The method of claim 1, further comprising:
    expressing jitter magnitude as a function of acquisition time.

4. The method of claim 1, further comprising:
    determining the jitter frequencies within a particular frequency range.

5. The method of claim 1, wherein measuring jitter further comprises:
    identifying transition regions in each subset of locally-in-order strobe data; and
    calculating the standard deviation of each transition region.

6. The method of claim 5, further comprising:
    calculating at least one of the average and root square average of all standard deviations.

7. The method of claim 1, wherein conducting a plurality of locally-in-order strobes of a waveform further comprises:
    asynchronously strobing the waveform for each locally-in-order strobing; and
    mapping strobes into associated subsets to form subsets of locally-in-order strobes.

8. A jitter measurement system, the system comprising:
    a means to take jitter measurements in a locally-in-order strobing scheme, wherein the locally-in-order strobing scheme includes locally-in-order strobings of a waveform based on undersampling strobing techniques that map strobes over a relatively large period of time to effective times within a test pattern;
    a means for changing an acquisition time in each locally-in-order strobing; and
    a means for expressing jitter as a function of frequency.

9. The jitter measurement system of claim 8, further comprising:
    a means to express jitter magnitude as a function of the acquisition time.

10. The jitter measurement system of claim 8, further comprising:
    a means to determine jitter frequencies within a particular frequency range.

* * * * *